United States Patent [19]
Nesbit

[11] Patent Number: 5,191,299
[45] Date of Patent: Mar. 2, 1993

[54] RADIAL POWER COMBINING OF FIELD-EFFECT TRANSISTOR-BASED AMPLIFIERS

[75] Inventor: Gerald H. Nesbit, Rollings Hills Estates, Calif.

[73] Assignee: TRW Inc., Redondo Beach, Calif.

[21] Appl. No.: 730,131

[22] Filed: Jul. 15, 1991

[51] Int. Cl.$^5$ .......................... H03F 3/68; H03F 3/60
[52] U.S. Cl. ...................................... 330/295; 330/286
[58] Field of Search ...................... 330/53, 124 R, 271, 330/286, 287, 295; 333/1.1

[56] References Cited
U.S. PATENT DOCUMENTS

| | | | |
|---|---|---|---|
| 4,085,377 | 4/1978 | Turski et al. | 330/53 X |
| 4,291,279 | 9/1981 | Buck | 330/287 |
| 4,931,747 | 6/1990 | Hom | 330/295 X |

Primary Examiner—Steven Mottola
Attorney, Agent, or Firm—G. Gregory Schivley; Ronald L. Taylor

[57] ABSTRACT

A radial power combining scheme is provided for combining a plurality of field-effect transistor-based amplifiers to form an amplifier circuit. The amplifier circuit includes input terminals for receiving high frequency power signals. A radial line power combiner/divider is provided for dividing the input signal amongst a plurality of amplifiers. The radial line power combiner/divider is further adapted to receive and combine the amplified signals which are then provided to an output. The circuit advantageously utilizes a plurality of three-port circulators for transmitting the signals within the circuit.

16 Claims, 2 Drawing Sheets

RADIAL POWER COMBINING OF FIELD-EFFECT TRANSISTOR-BASED AMPLIFIERS

BACKGROUND OF THE INVENTION

1. Technical Field

This invention relates to amplifiers and, more particularly, to a power combining scheme for combining a plurality of field-effect transistor-based amplifiers.

2. Discussion

In order for millimeter-wave communication systems to be feasible, they generally require high power levels. In the past, the high power requirement had been fulfilled by the traveling wave tubes amplifiers (TWTA). However, the large size, heavy weight and the requirement of extremely high supply voltage for such amplifiers makes it less attractive for space related applications and the like. Currently, the trend has shifted towards using three-terminal solid-state devices such as field-effect transistors (FET), in order to meet the necessary power requirements. These solid-state devices are advantageously smaller, lighter, much more reliable and have low DC power consumption.

In the arena of field-effect transistors, the high electron mobility transistor (HEMT) devices are preferred because of their superior radio frequency (RF) performance in the millimeter-wave frequency range. Currently, however, the available radio frequency power output from a single HEMT amplifier is minimal. Therefore, it is necessary to combine the output power from a plurality of HEMT amplifiers in order to achieve higher power levels. The general scheme of power combining amplifiers in the millimeter-wave frequency range typically includes a radial line for power dividing an input signal amongst the plurality of amplifiers, and a separate radial line for combining the amplified output signals of each amplifier to obtain the output. However, the use of separate power dividing and power combining lines adds to the overall size, weight, cost and complexity of the system.

It is therefore desirable to provide a power combining scheme for combining a plurality of amplifiers which does not require separate radial lines for power dividing and power combining. It is furthermore desirable to provide a single radial line power combiner/divider which eliminates the need for a second radial line to thereby provide a smaller, lighter, more simplified and more cost efficient amplifier system.

SUMMARY OF THE INVENTION

In accordance with the teachings of the present invention, a radial power combining scheme is provided for combining a plurality of amplifiers. A plurality of amplifiers are provided in parallel for receiving a high frequency power signal and providing an amplified output response. A radial line power divider/combiner is provided for dividing the input signal amongst the plurality of amplifiers and combining the amplified output response of each. Coupled to each of the plurality of amplifiers is a circulator for allowing the input signal to pass to the input of the amplifier. Each circulator is further adapted to receive amplified output signals from the output of the amplifier and allow the amplified signal to be transmitted on the radial line power divider/combiner to an output terminal.

BRIEF DESCRIPTION OF THE DRAWINGS

The various advantages of the present invention will become apparent to those skilled in the art by reading the following specification and by reference to the following drawings in which.

DESCRIPTION OF THE PREFERRED EMBODIMENT

Figure 1:
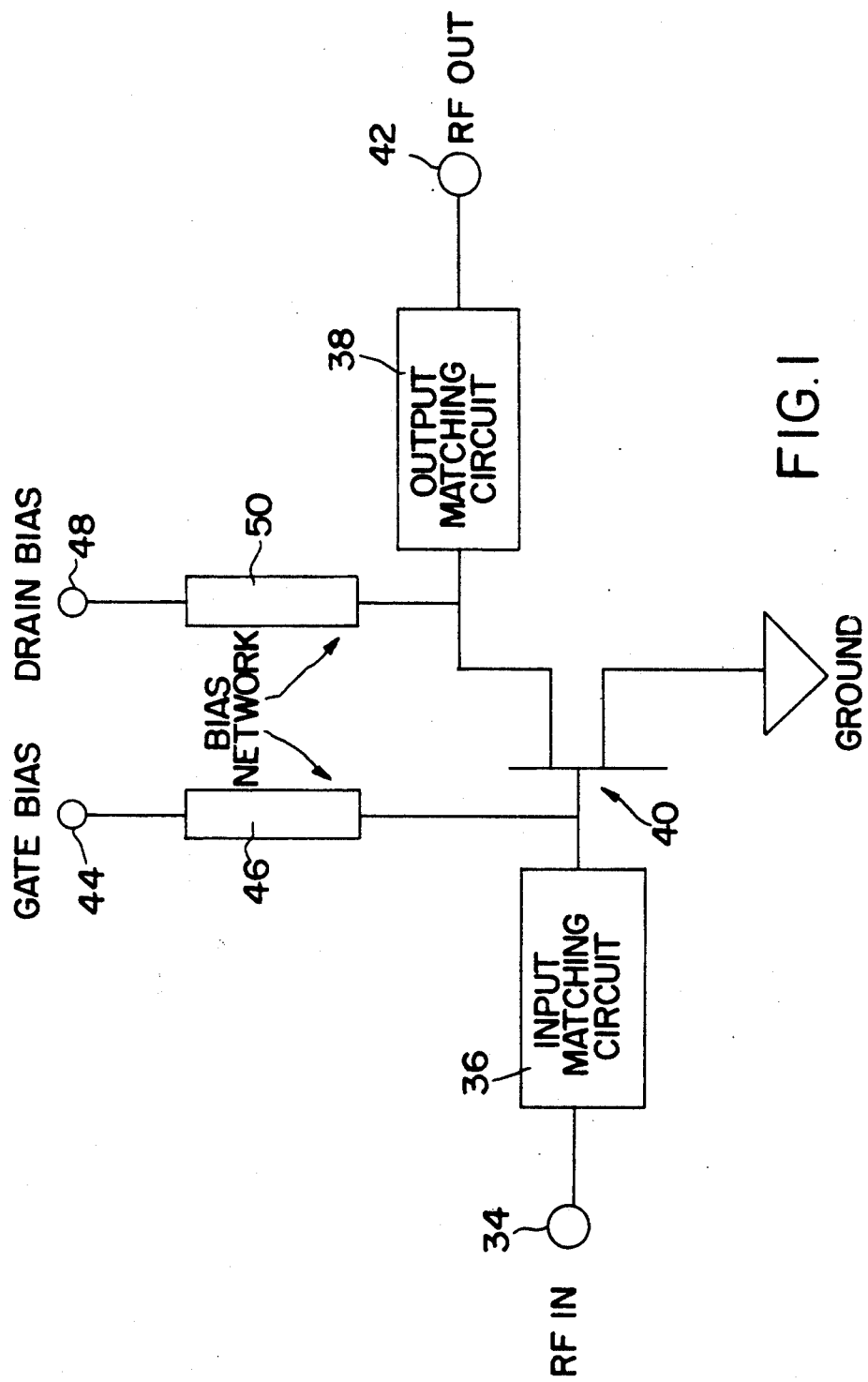
FIG. 1 is a schematic diagram illustrating a field-effect transistor-based amplifier.

FIG. 1 illustrates a standard field-effect transistor-based amplifier. Included is an amplifier input terminal 34 and an amplifier output terminal 42. Input terminal 34 is connected to a standard input matching circuit 36. Output terminal 42 is likewise connected to an output matching circuit 38. A transistor 40 is connected between the input matching circuit 34 and output matching circuit 38. Transistor 40 is preferably a high electron mobility transistor (HEMT) or metal-semiconductor field-effect transistor (MESFET) for RF frequencies signals in the microwave and millimeter-wave frequency range. The HEMT is preferred over the MESFET for power signals in the millimeter-wave frequency range.

Further connected to the input of the transistor 40 is bias network 46 having a gate bias 44 connected thereto. Similarly, a second bias network 50 having a drain bias 48 connected thereto, is further connected to the output of transistor 40. Transistor 40 further has a third terminal connected to ground.

Figure 2:
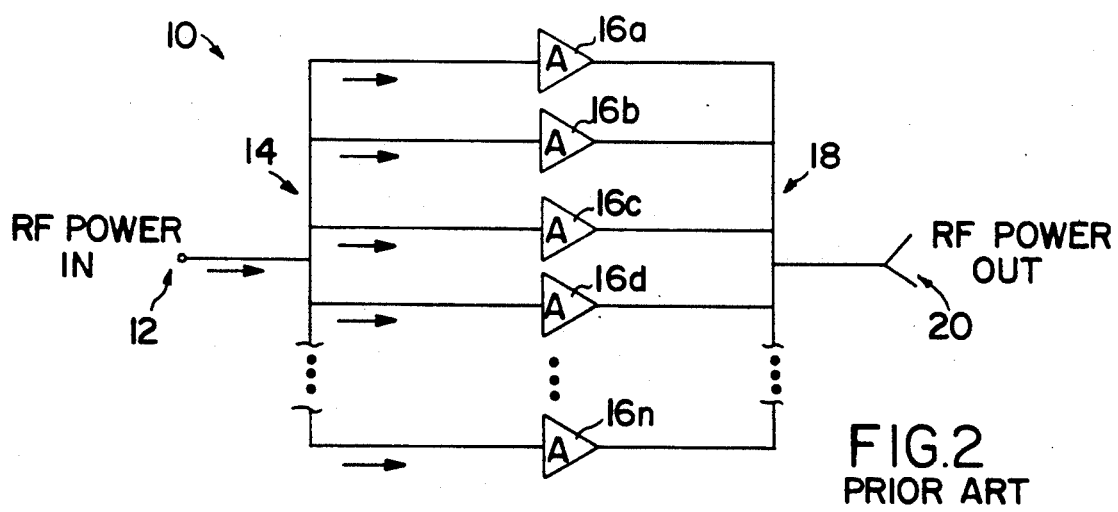
FIG. 2 is a block diagram illustrating a conventional power combining scheme for combining amplifiers in accordance with the prior art.

Turning now to FIG. 2, there is shown a typical power combining scheme for combining a plurality of amplifiers in accordance with the prior art. An amplifier circuit 10 is shown, having a plurality of transistor-based amplifiers 16a through 16n connected in parallel. An input terminal 12 is provided for receiving high frequency power signals. A radial line power divider 14 is connected between the input terminal 12 and each of the plurality of amplifiers 16a through 16n. Radial line power divider 14 divides and distributes the high frequency input power signal to each of the plurality of amplifiers 16a through 16n. Coupled to the output of each of the amplifiers 16a through 16n is a radial line power combiner 18 for receiving and combining the amplified output signal of each of the amplifiers to provide an amplified output signal. Furthermore, an antenna 20 is connected to the output of the radial line power combiner 18 for transmitting the amplified output signal therefrom.

Figure 3:
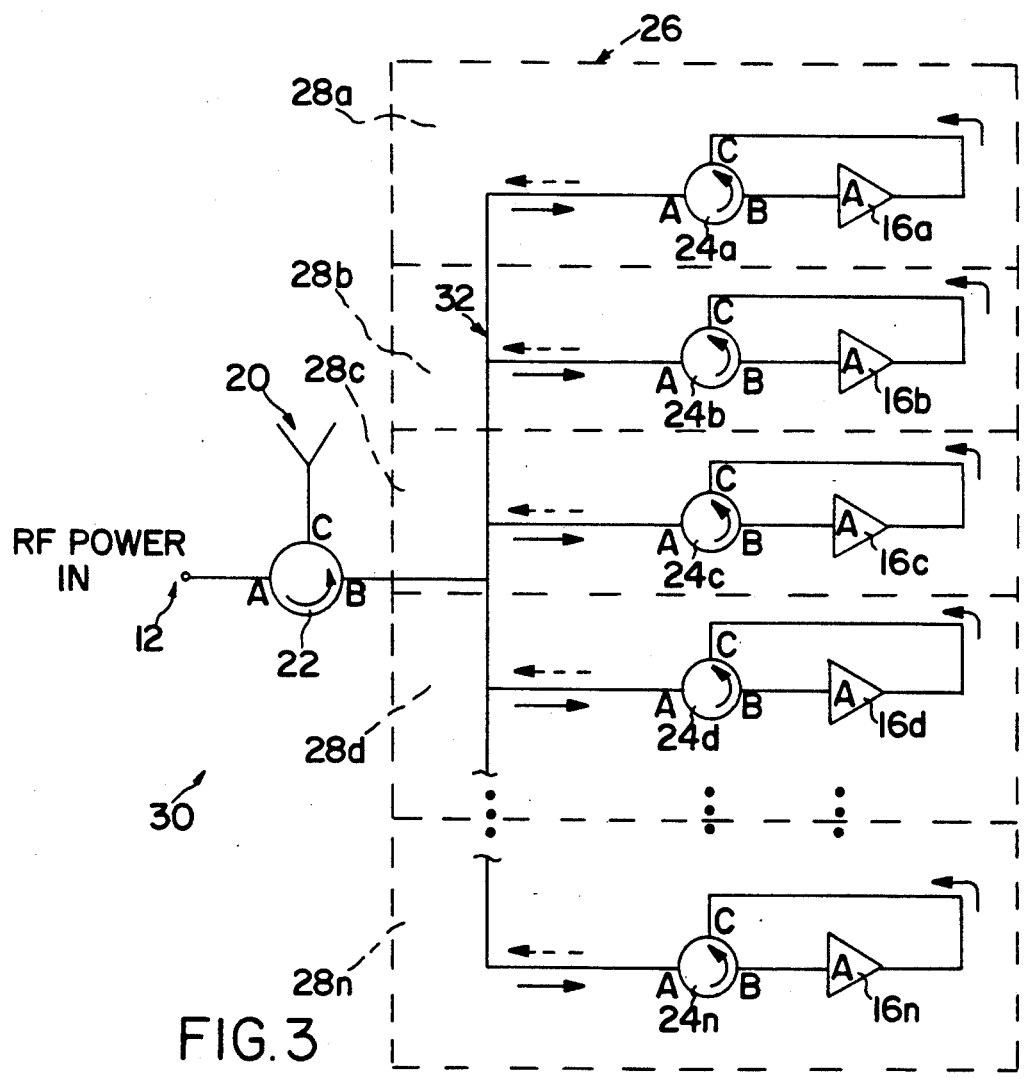
FIG. 3 is a block diagram which illustrates the power combining scheme for combining a plurality of amplifiers in accordance with the present invention.

FIG. 3 illustrates a power combining scheme for combining a plurality of amplifiers in accordance with the present invention. An amplifier circuit 30 having a plurality of amplifiers 16a through 16n is shown therein. An input terminal 12 is provided for receiving high frequency power signals, preferably within the microwave and millimeter-wave frequency range (i.e., 1-100 gigahertz). A first circulator 22 is provided for controlling the direction of incoming signals. First circulator 22 is a three-port, nonreciprocal circulator having a first, second and third port as illustrated by port A, port B and port C. First circulator 22 is a standard off-theshelf passive circulating device. Port A of first circulator 22 is connected to the input terminal 12. An antenna 20 is provided for transmitting amplified output signals therefrom. Antenna 20 is connected to port C of first circulator 22. Port B of first circulator 22 is connected to a network 26 having a plurality of amplification branches 28a through 28n.

Network 26 includes a radial line power combiner/divider 32 which receives the input power signal from port B of circulator 22 and divides and equally distributes the power signal to the plurality of amplification branches 28a through 28n. Each of the plurality of amplification branches 28a through 28n includes an amplifier 16a through 16n and a circulator 24a through 24n. Amplifiers 16a through 16n are most preferably high electron mobility transistor (HEMT) amplifiers, which provide superior performance in the millimeter-wave frequency range. However, alternate solid-state amplifiers such as metal-semiconductor field-effect transistor (MESFET) amplifiers and other similar devices may be used, but such amplifiers generally do not provide the superior performance in the millimeter-wave frequency range.

Circulators 24a through 24n are of the same as first circulator 22. Each of circulators 24a through 24n have first, second, and third ports as illustrated by port A, port B, and port C of each of circulators 24a through 24n. Port A of each of circulators 24a through 24n is connected to the radial line power combiner/divider 32. Radial line power combiner/divider 32 allows the transmission of input signals from port B of first circulator 22 to port A of each of the circulators 24a through 24n. Likewise, radial line power combiner/divider 32 further allows the transmission of amplified signals from port A of each of circulators 24a through 24n to port B of first circulator 24. Port B of each of circulators 24a through 24n is connected to the input of its associated amplifier 16. As such, circulator 24 allows incoming signals to enter port A and exit through port B where the signals are transmitted to amplifier 16.

The output of amplifier 16 is further connected to port C of circulator 24. As such, the amplified output signals of each of amplifiers 16a through 16n are allowed to pass from port C to port A of circulator 24. Radial line power combiner/divider 32 then receives the amplified output signal from port A of circulator 24 whereby it combines the plurality of amplified output signals to provide the amplified output response of the input signal. Furthermore, the first circulator 22 allows the amplified output response to enter port B and exit through port C. Connected to port C of first circulator 22 is antenna 20 for transmitting the output response therefrom.

In operation, amplifier circuit 30 receives a high frequency power signal at input terminal 12. The input signal enters port A of first circulator 22 and exits out through port B to radial line power combiner/divider 32. Radial line power combiner/divider 32 divides the incoming signal amongst the plurality of amplification branches 28a through 28n, each branch including a circulator 24 being coupled to an amplifier 16. The divided power signals enter port A of circulator 24 and exit through port B. Each divided signal is then amplified by amplifiers 16a through 16n. The amplified output of each divided power signal is further provided to port C of circulator 24 which allows the amplified signal to enter port C and exit through port A to the radial line power combiner/divider 32. Radial line power combiner/divider 32 combines the amplified power signals. The combined amplified power signal then enters port B of first circulator 22 and exits through port C to antenna 20 for transmission therefrom.

The amplifier circuit 30 advantageously utilizes a radial line power combiner/divider in conjunction with a plurality of three-port circulators to thereby eliminate the need for a separate radial line power combiner and power divider. In addition, the three-port circulators also provide for improved RF isolation between the plurality of HEMT amplifiers.

In view of the foregoing, it can be appreciated that the present invention enables the user to achieve a more simplified power combining scheme for combining a plurality of amplifiers without the requirement of a separate radial line power divider and power combiner. Thus, while this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. An amplifier circuit employing a plurality of amplifiers for amplifying a high frequency signal, said circuit comprising:

input means for receiving a high frequency input signal;

output means for supplying an amplified output signal therefrom;

a network including a plurality of amplifiers, each amplifier having an input path for receiving a portion of said input signal and an output path for providing a portion of said output signal wherein said input path is separate from said output path; and a radial power combiner/divider means having a plurality of power lines extending therefrom, each line being respectively coupled to one of said amplifiers, said radial power combiner/divider means transmitting portions of the input signal to each of the plurality of amplifiers via respective power lines, and said combiner/divider means also serving to receive said portions of said output signal from the output path of each of said amplifiers via the same respective power lines and combine said portions of said output signals to provide said amplified output signal.

2. The circuit of claim 1 further comprising:

a first circulator having first, second, and third ports, said first port connected to said input means for receiving the input signal, said second port being adapted to transmit said input signal therefrom and being further adapted to receive said output signal; said third port coupled to the output means for transmitting said output signal thereto.

3. The circuit of claim 1, wherein said network further comprises:

a plurality of circulators, each circulator being connected between one line of said radial power combiner/divider means and one of said plurality of amplifiers associated therewith.

4. The circuit of claim 3, wherein each of said plurality of circulators comprises:

a first port for receiving one of said portions of said input signal from one line of said radial power combiner/divider means, a second port for providing said portion of said input signal to said input path of said associated amplifier, and a third port for receiving said portion of said output signal from the output path of said amplifier, said first port further transmitting the portion of said output signal to said one line of said radial power combiner/divider means.

5. The circuit of claim 4 wherein said output means includes an antenna adapted to transmit the amplified high frequency output signal therefrom.

6. The circuit of claim 1 wherein each of said plurality of amplifiers includes a high electron mobility transistor (HEMT).

7. The circuit of claim 6 wherein each of said plurality of amplifiers includes a field-effect transistor-based amplifier.

8. An amplifier circuit for amplifying a high frequency power signal, said circuit comprising:
input means for receiving a high frequency input signal;
output means for supplying an amplified output signal therefrom;
a first circulator having first, second and third ports, said first port coupled to the input means for receiving said input signal, said second port being adapted to transmit said input signal therefrom and further adapted to receive said amplified output signal; said third port coupled to the output means for transmitting said output signal thereto;
a network comprising a plurality of amplifiers being connected in parallel, each amplifier having an output and further having an associated circulator coupled to its input for receiving input signals and transmitting said input signals to each amplifier associated therewith, each of said amplifier outputs being connected to said associated circulators for transmission therefrom; and
a radial power combiner/divider means having a base line connected to said second port of the first circulator and a plurality of power lines extending therefrom, each power line being connected to one of said associated circulators, said radial power combiner/divider means adapted to evenly divide the input signal amongst the plurality of amplifiers and further adapted to receive and combine the plurality of amplified outputs therefrom.

9. The circuit of claim 8 wherein each of said associated circulators comprises:
a first port connected to one of said power lines of the radial power combiner/divider means for receiving incoming signals therefrom;
a second port connected to the input of said amplifier for providing incoming signals to said amplifier; and
a third port connected to the output of said amplifier for receiving an amplified signal therefrom, said first port being further adapted to transmit the amplified signal to said power line of said radial power combiner/divider means.

10. The circuit of claim 9 wherein said output means includes an antenna adapted for transmitting the amplified output signal therefrom.

11. The circuit of claim 10 wherein each of said plurality of amplifiers includes a high electron mobility transistor (HEMT).

12. The circuit of claim 10 wherein each of said plurality of amplifiers includes a field-effect transistor-based amplifier.

13. A method for amplifying a high frequency power signal, said method comprising:
receiving a high frequency input power signal;
splitting the high frequency input power signal with a radial power combiner/divider means having a plurality of power lines to provide a plurality of split power signals;
transmitting each of the split power signals along one of said power lines to one of a plurality of amplifiers via an amplifier input path;
amplifying each power split signal to provide a plurality of amplifier output signals;
providing each of said amplifier output signals to one said power line of said radial power combiner/divider means via an amplifier output path which is separate from said input path;
transmitting the amplifier output signals along the power lines of said radial power combiner/divider means, said amplifier output signals being transmitted in the opposite direction of the input signal; and
summing the amplifier output signal received from the plurality of said amplifiers to provide an amplified output signal.

14. The method of claim 13 further comprising the step of circulating the split power signals amplifier output signals such that each split power signal is transmitted from one of said power lines of said radial power combiner/divider means to the input path of said amplifier and each said amplifier output signal is allowed to be transmitted from the amplifier output via said output path to one said power line of the radial power combiner/divider means for transmission thereon.

15. The method of claim 13 further comprising the step of circulating the input power signal and the amplified output signal such that said input power signal is allowed to be received and transmitted to said radial power combiner/divider means and said amplified output signal is allowed to be received from said radial power combiner/divider means and transmitted to an output means.

16. The method of claim 14 further comprising the step of applying the amplified output signal to an antenna for transmission therefrom.

* * * * *